(12) United States Patent
Yoneda

(10) Patent No.: US 6,168,296 B1
(45) Date of Patent: Jan. 2, 2001

(54) LIGHTING UNIT FOR READING MARKS

(75) Inventor: Kenji Yoneda, Kyoto (JP)

(73) Assignee: CCS Co., Ltd., Kyoto (JP)

( * ) Notice: Under 35 U.S.C. 154(b), the term of this patent shall be extended for 0 days.

(21) Appl. No.: 09/102,061

(22) Filed: Jun. 22, 1998

(51) Int. Cl.[7] ....................................................... F21V 7/00
(52) U.S. Cl. .......................... 362/341; 362/244; 362/245; 362/268
(58) Field of Search ..................................... 362/244, 243, 362/242, 245, 341; 348/87, 92

(56) References Cited

U.S. PATENT DOCUMENTS

| | | | |
|---|---|---|---|
| 5,737,112 | * | 4/1998 | Wilt et al. ................................ 359/436 |
| 5,954,424 | * | 9/1999 | Anderson et al. ....................... 362/243 |

* cited by examiner

Primary Examiner—Thomas M. Sember
Assistant Examiner—John Anthony Ward
(74) Attorney, Agent, or Firm—Banner & Witcoff, Ltd.

(57) ABSTRACT

An object of the invention is to obtain a lighting unit for reading marks which makes it possible with accuracy to read a mark carved on a surface of a base whose surface is specular finished.

A lighting unit for reading marks in accordance with the invention comprises two light sources 51 and 52 and a light parallel means 6 which makes rays of light emitted from each of the light sources 51 and 52 parallel or generally parallel respectively. Each of the rays of light emitted from the light sources 51 and 52 are made parallel respectively by the light parallel means 6 and irradiated on two areas 18 and 19 of the base 3 and the two areas 18 and 9 face each other across the mark 4 carved on the base 3.

4 Claims, 5 Drawing Sheets

LIGHTING UNIT FOR READING MARKS

BACKGROUND OF THE INVENTION

This invention relates to a lighting unit for reading marks which makes it possible to read a mark carved on a specular finished surface of a base such as a silicon wafer or a glass base.

Generally a silicon wafer or a glass base as a raw material of an integrated circuit has a specular finished surface. On the surface of the wafer or base carved is an identification mark consisting of a series of characters such as a manufacturing number or a specification number. The base or wafer is to be classified for its use according to the identification mark carved on the surface thereof. However, it is very hard to read and identify the identification mark just by a visual observation since the identification mark is carved by means of laser etching or photo etching. Conventionally an area-illuminating lighting unit or a ring-shaped lighting unit is used to illuminate the identification mark or the surrounding area of the identification mark and then the light reflected in the identification mark is read by means of a TV camera or a visual observation.

However, it sometimes happens that a series of characters as an identification mark is failed to be read accurately due to deterioration of the surface of the base or depending on a kind of the base. If an identification mark consists of a long series of characters, the center portion of the identification mark is difficult to be read. In such a case the identification mark is likely to be misread.

In order to solve the above-mentioned problems, the inventor has devoted himself to conducting various experiments and reached a following solution. If two light sources are arranged separately, rays of light emitted from each of the light sources are made parallel and then they are irradiated on a mark, it is possible to read a mark accurately by means of light reflection into the mark. Then the inventor finally accomplished the lighting unit for reading marks in accordance with this invention. It is an object of the present invention to provide a lighting unit for reading marks which can read a mark carved on a base accurately with a simple arrangement.

SUMMARY OF THE INVENTION

In order to accomplish the above-mentioned object the invention is characterized by the following structure. The lighting unit for reading marks in accordance with the invention makes it possible to read a mark carved on a surface of a base having a surface of specular finished, and characterized by that comprising two light sources and a light parallel means which makes rays of light emitted from each of the light sources parallel or generally parallel respectively and that each of the rays of light emitted from the two light sources are made parallel respectively by the light parallel means and irradiated on two areas of the base wherein the two areas face each other across the mark carved on the base.

In order to obtain an effective light source for reading a mark with a simple arrangement it is preferable that an illuminating surface of an illuminant is provided with a single slit which divides the illuminating surface into two illuminating areas and that each of the illuminating areas serves as the light source.

In accordance with the invention, the following functions and effects are achieved.

Since the lighting unit for reading marks in accordance with the invention comprises two light sources and a light parallel means which makes rays of light emitted from each of the light sources parallel or generally parallel respectively and each of the rays of light emitted from the two light sources are made parallel respectively by the light parallel means and irradiated on two area of the base wherein the two areas face each other across the mark carved on the base, the mark can be read easily and accurately with a simple arrangement of the lighting unit without using a complicated appliance such as a computer or conducting a complicated treatment. In addition, since the rays of light are made parallel by means of a light parallel means, a distance between the light source and the base can be set short, thereby to downsize the lighting unit.

Further, if the lighting unit for reading marks has such an arrangement that an illuminating surface of an illuminant is provided with a single slit which divides the illuminating surface into two illuminating areas and each of the illuminating areas serves as the light source, it is possible to obtain an effective light source for reading a mark with a simple arrangement.

BRIEF DESCRIPTION OF THE DRAWINGS

The objects and features of the invention may be understood with reference to the following detailed description of illustrative embodiments of the invention, taken together with the accompanying drawings in which.

DETAILED DESCRIPTION OF THE PREFERRED EMBODIMENTS

Figure 5:
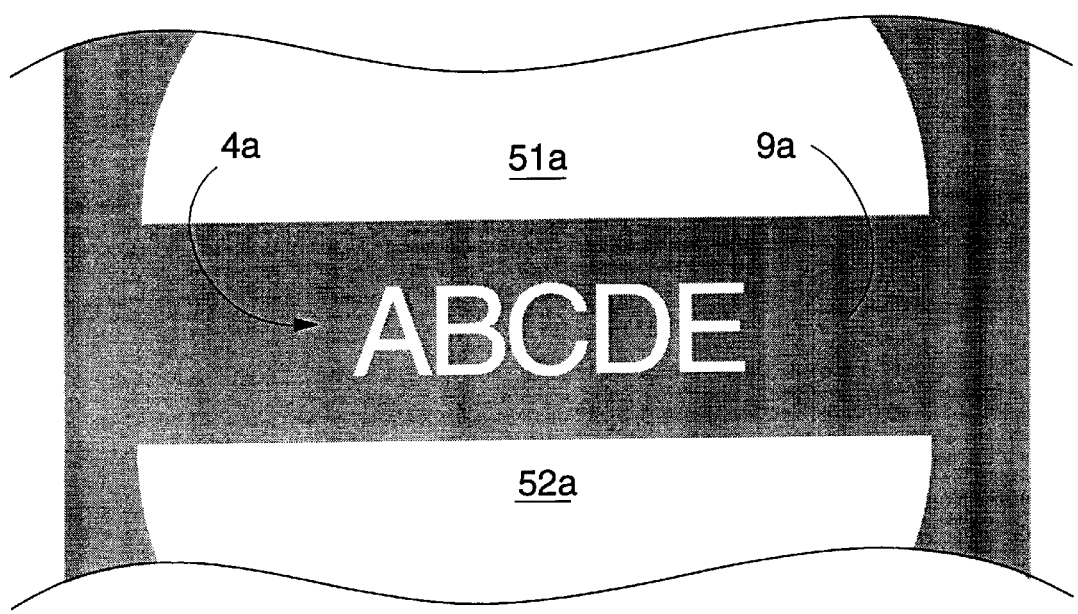
FIG. 5 is a view showing a state of a mark expressed by means of the lighting unit in accordance with the preferred embodiment.

An embodiment of the invention will now be described below with reference to FIGS. 1 and 5.

A lighting unit for reading marks in accordance with the embodiment is for use in reading a series of characters 4 as a mark carved on a base 3. The lighting unit, as shown in FIG. 1, has such an arrangement that a light emitting unit 11, lenses 6 as a light parallel means for making rays of light parallel and a mirror 12 are mounted in a casing 10. In this embodiment a TV camera 13 for reading marks is also mounted in the casing 10 and a camera lens 13a is arranged in the front end of the TV camera 13.

Figure 2:
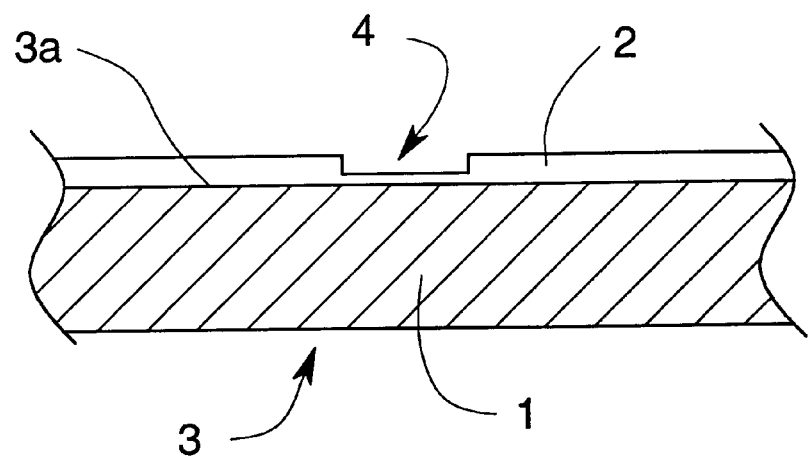
FIG. 2 is a partial cross sectional view of a base in accordance with the preferred embodiment.

The base 3 comprises, as shown in FIG. 2, an opaque base body 1 such as a silicon wafer whose surface 3a is specular finished and a transparent thin film 2 attached to the surface 3a thereof. On the transparent thin film 2 carved is a series of characters 4 such as a manufacturing number or a specification number for identification. Therefore, generally it is very hard to read the series of characters 4.

Figure 1:
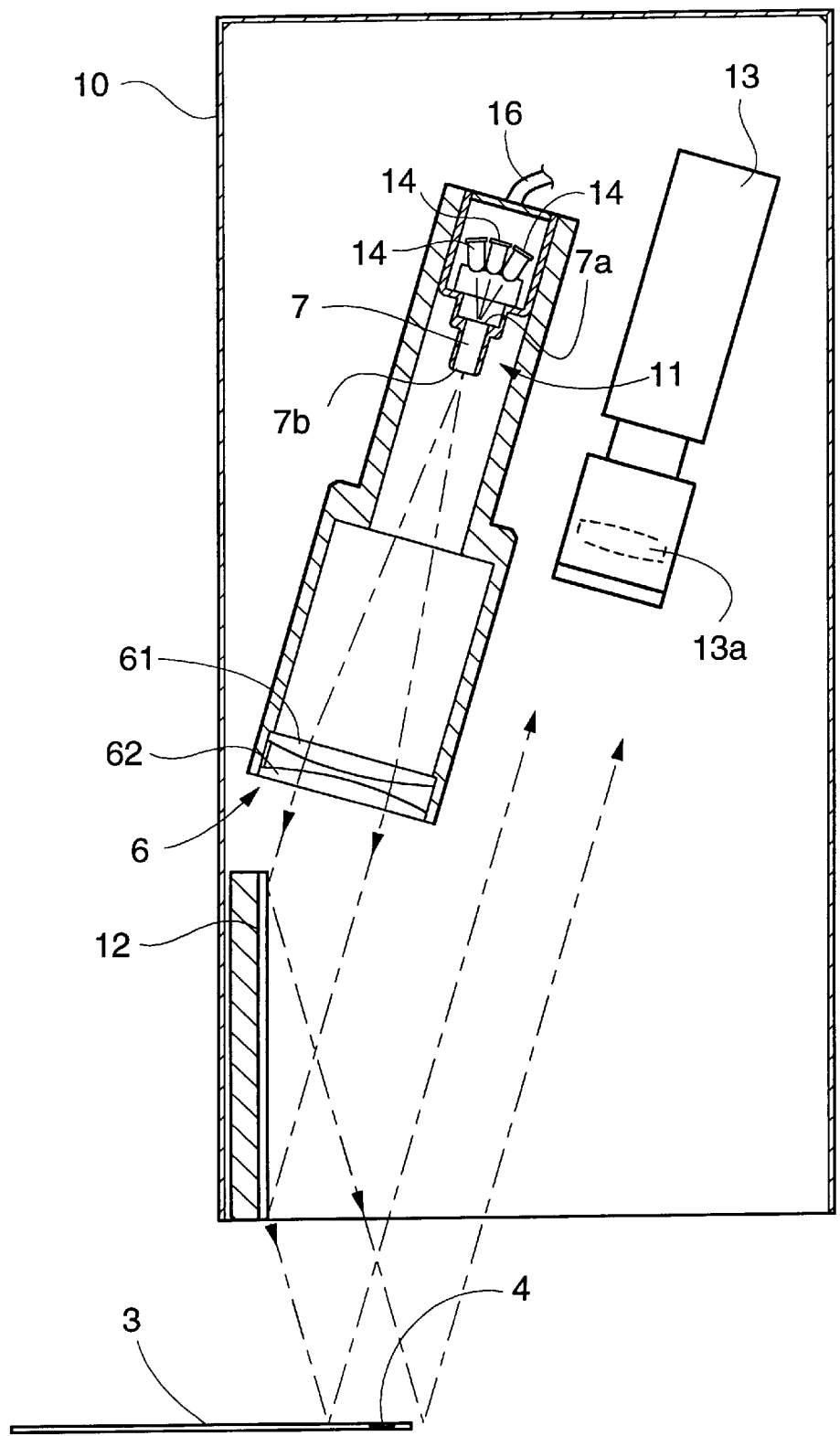
FIG. 1 is a general cross sectional view of a lighting unit for reading marks showing a preferred embodiment of this invention.
Figure 3:
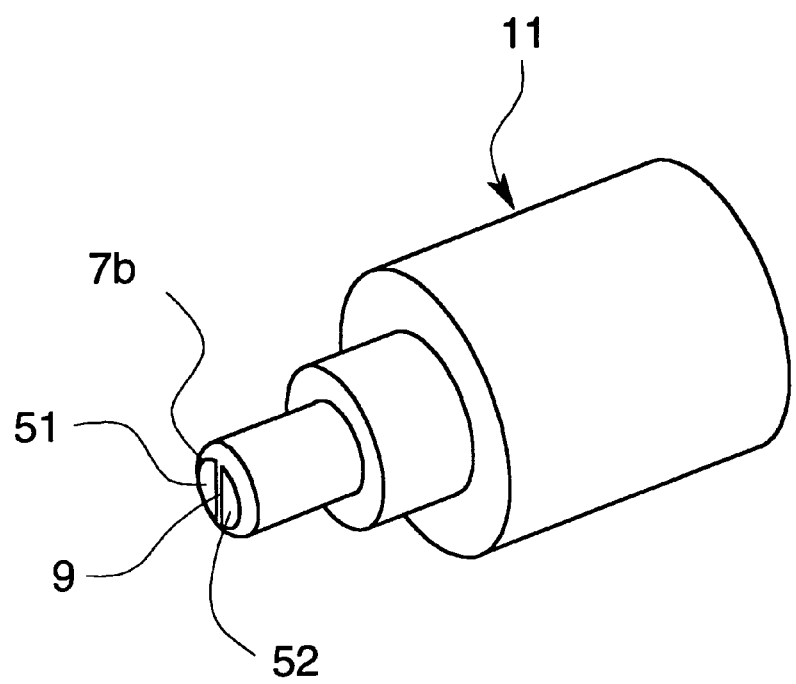
FIG. 3 is a general perspective view of a light emitting unit in accordance with the preferred embodiment.

More specifically, as shown in FIGS. 1 and 3, the light emitting unit 11 comprises a plurality of light-emitting diodes (LED) 14 and a cylindrical transparent body 7 as an illuminant which is made of glass or something like that. Rays of light emitted from the LEDs 14 are introduced into inside the transparent body 7 through one end 7a of the transparent body 7 and are sent out through another end 7b thereof so as to illuminate the end 7b. A plurality of LEDs 14 are provided with power through a power cable 16 and emit light at the same time. Each of the LEDs 14 are so arranged that the rays of light emitted from the LEDs 14 are gathered to irradiate on the end 7a. As described above, the transparent body 7 is a solid cylinder and sends out the rays of light introduced from the end 7a thereof through the end 7b thereof. Since the end 7b of the transparent body 7 is ground processed so as to diffuse light, the rays of light are emitted uniformly through all of the area of the end 7b. The end 7b is, as shown in FIG. 3, provided with a slit 9 which divides the end 7b into two illuminating areas 51 and 52. Each of the illuminating areas 51 and 52 serves as the light source.

The lenses 6 are to make the rays of light emitted from the light emitting unit 11 parallel or generally parallel. In this embodiment a pair of the lenses 6 are made by dividing a convex lens into two pieces along a longitudinal direction of the convex lens and arranged with each of the convex surfaces face to face as shown in FIG. 1. Instead of the lenses 6 ordinary convex lens may be used.

A mirror 12 is to change the irradiation direction of the rays of light which are made parallel by the lenses 6 so as to irradiate the light on the base 3. The mirror 12 is arranged to prevent interference of the TV camera 13 and light emitting unit 11. The mirror 12 also contributes to downsizing the casing 10.

The TV camera 13 is arranged on the optical path of the light reflected in the base 3 and creates an image of the reflected light through a camera lens 13a arranged in front of the TV camera 13.

Followings are the operation of the lighting unit for reading marks in accordance with the embodiment.

Figure 4:
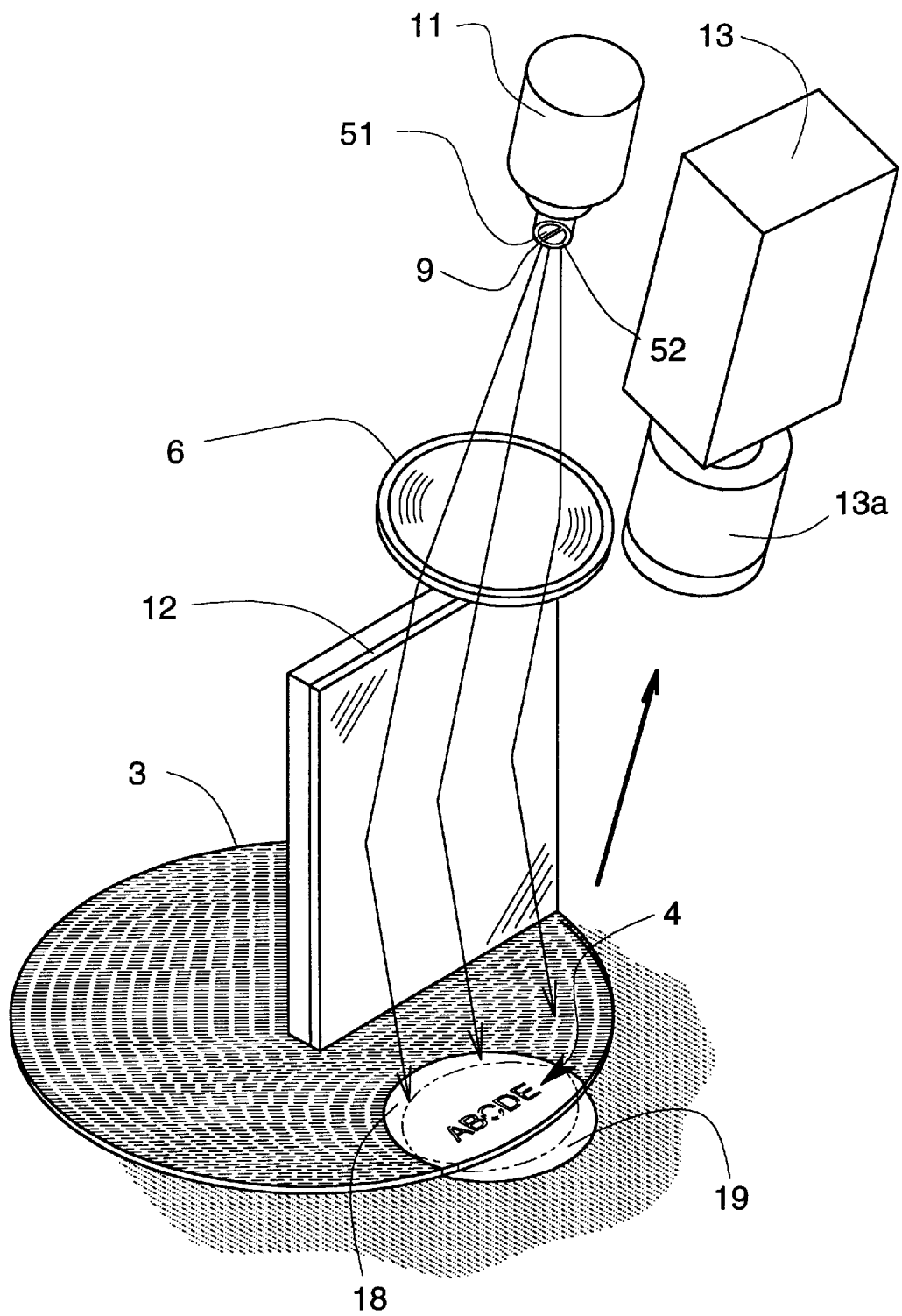
FIG. 4 is an explanatory view explaining an operation of the preferred embodiment.

As shown in FIG. 4, the rays of light emitted through the slit 9 from the light emitting unit 11 are made parallel or generally parallel by the lenses 6. Then irradiation direction of the rays of light is changed so that the rays of light are irradiated on the base 3. In this case the parallel rays of light emitted from the illuminating area 51 are adjusted to irradiate on the area 18 of the base 3 and the parallel rays of light emitted from the illuminating area 52 are adjusted to irradiate on the area 19 of the base 3 and the areas 18 and 19 face each other across the series of characters 4. In this embodiment each of the rays of light overlap partially, namely part of the areas 18 and 19 overlap.

When the reflected light is taken by the TV camera 13, the series of characters 4 is reflected in the background of the magnified virtual images of the slit 9 and the illuminating areas 51 and 52 if focused on the series of characters 4. In other words, the images created by the TV camera 13 are, as shown in FIG. 5, an image 9a of the slit 9, images 51a and 52a of the illuminating areas 51 and 52 and an image 4a of the series of characters 4.

Due to diffused reflection or subtle refraction which occurs in the portion on which the series of characters 4 is carved, the image 4a of the series of characters 4 looks as if it is actually illuminating. In addition, since each of the rays of light emitted from the illuminating areas 51 and 52 are so adjusted to irradiate the areas 18 and 19 respectively and the areas 18 and 19 face each other across the series of characters 4, the image 4a of the series of characters 4 is created in the image 9a of the slit 9 as a dark portion. Therefore, the image 4a of the series of characters 4 appears clearly in the image 9a of the slit 9, thereby to make it possible to read the series of characters 4 with accuracy.

In accordance with the invention, the series of characters 4 can be read easily and accurately with a simple arrangement of the lighting unit. In addition, since the rays of light are made parallel or generally parallel by means of lenses 6, it is not required to place the light sources 51 and 52 at a long distance from the base 3 in order to make the rays of light parallel. Therefore a distance between the light emitting unit 11 and the base 3 can be shortened, thereby to make it possible to downsize the lighting unit. Further the lighting unit in accordance with the invention can be obtained just by simple conversion of an existing lighting unit. In other words, two illuminating areas 51 and 52 can be obtained by just dividing an illuminating surface 7b of an illuminant 7 into two by a slit 9. Especially, since the slit 9 is used to divide the illuminating surface 7b, the image 9a of the slit 9 becomes rectangular. Since this rectangular shape accords with a general whole shape of the series of characters 4, the series of characters 4 can effectively and clearly be expressed in the background of the image 4a of the slit 9.

This invention is not limited to the embodiments described in detail hereinabove and there may be various modifications. For example, the light emitting unit and the camera may be arranged symmetrically across the series of characters and the rays of light are irradiated directly on the base without using a mirror. In this case, although a casing becomes a little larger, a mirror can be omitted.

Figure 6:
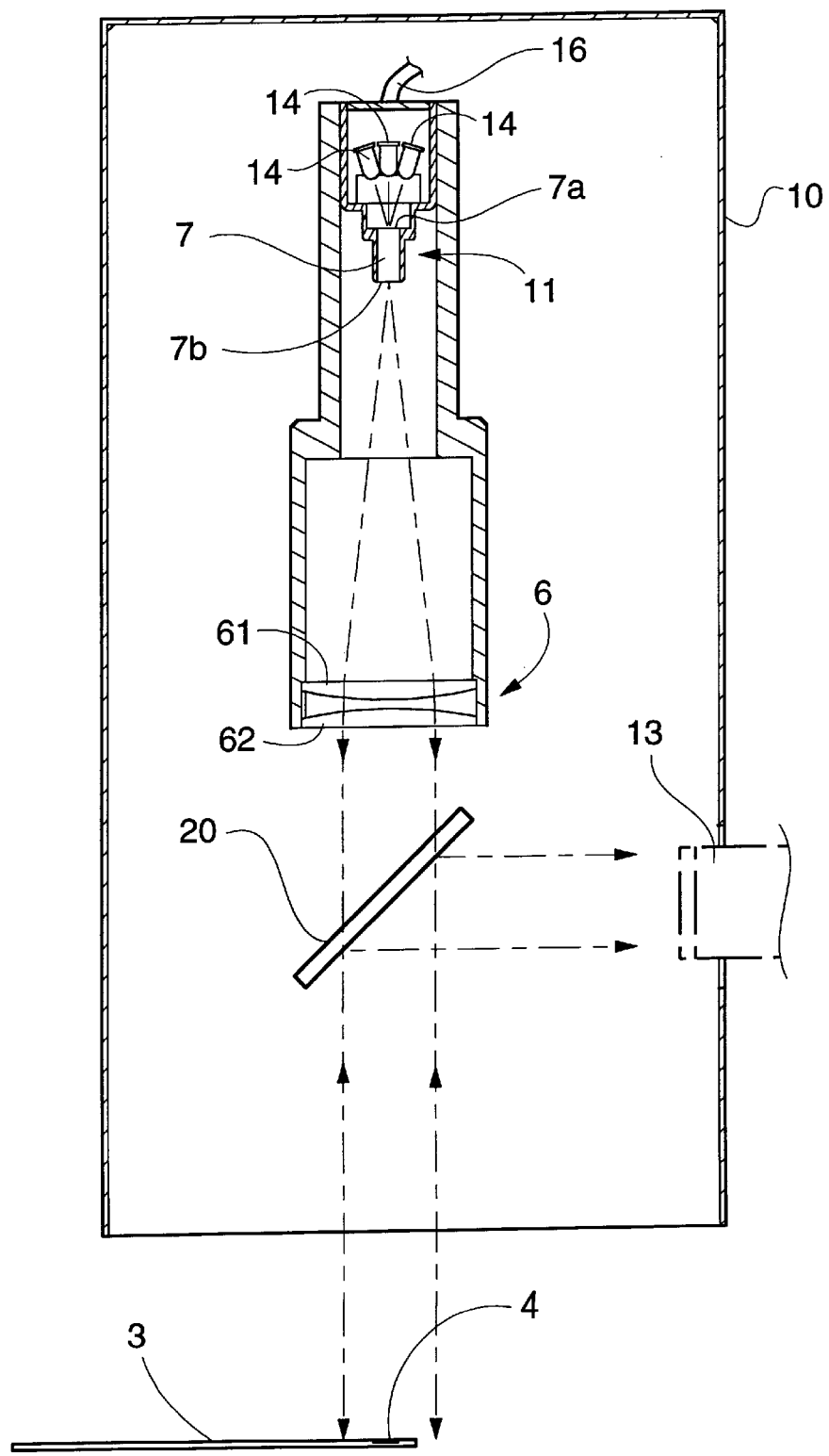
FIG. 6 is a general cross sectional view showing a lighting unit for reading marks in accordance with a different preferred embodiment.

In addition, as another embodiment of the invention the lighting unit may have such an arrangement as shown in FIG. 6. More specifically, the light emitting unit 11 is arranged right above the base 3. Parallel rays of light which are made parallel or generally parallel by the lenses 6 are irradiated on the base 3 after passing through a half mirror 20. The parallel rays of light reflect in the base 3 and then reflect in the half mirror 20 so as to be introduced into a side of a straight line which links the lenses 6 and the base 3. The TV camera 13 is arranged on the optical path of the light reflected in the half mirror 20 and creates an image of the series of characters 14. In this case the TV camera 13, the light emitting unit 11 and the lenses 6 may be arranged in an opposite position. In this another embodiment the same reference numerals are given to the same elements as those of the embodiment.

There may be other variations of the arrangement. The same effect of the embodiment will be achieved as far as a camera is arranged on an optical path of the light reflected in a base. The reflected rays of light may be observed by direct visual observation instead of a camera.

Further, the material of the base to which the lighting unit for reading marks of the invention is applied may be anything as far as the surface of the base is specular finished and a mark is carved on the surface thereof. For example, the same effects will be achieved if the lighting unit is applied to an opaque material having no transparent thin film such as a metal plate or silicon wafer or a transparent material such as glass base.

Two light sources may not be limited to that in which an illuminating surface of an illuminant is divided into two illuminating areas by a slit, but may be two illuminants which are arranged parallel. In this embodiment as an illuminant used is a transparent body which emits rays of light indirectly by means of LED, but an element of an illuminant such as LED may be used as an illuminant. The element of an illuminant may also be other than LED.

Moreover, each of the arrangements is not limited to that illustrated in the figures and there may be various modifications without departing from the spirit and essential characteristics thereof.

What is claimed is:

1. A lighting unit for reading marks which makes it possible to read a mark carved on a surface of a base having a specular finished surface by using a means, which is arranged on an optical path of light reflected from the base, for reading the mark on the base, comprising two light sources and a plurality of lenses which makes rays of light emitted from each of said light sources parallel or generally parallel and that each of the rays of light emitted from the two light sources are made parallel to each other by said plurality of lenses and irradiated on two areas of the base wherein the two areas face each other across the mark carved on the base.

2. The lighting unit for reading marks as described in claim 1, characterized by that an illuminating surface of an illuminant is provided with a single slit which divides said illuminating surface into two illuminating areas and each of the illuminating areas serves as said light source.

3. A system for reading a mark carved on a surface of a base having a specular finished surface, comprising:

first and second light sources emitting rays of light;

a plurality of lenses making the rays of light parallel or generally parallel to each other, wherein the rays of light are irradiated on two areas of the base that face each other across the mark carved on the base; and a means for reading the mark on the base, which is arranged on an optical path of light reflected from the base.

4. The system of claim 3, wherein said means for reading is a TV camera.

* * * * *